United States Patent [19]
Verbakel et al.

[11] Patent Number: 5,243,625
[45] Date of Patent: Sep. 7, 1993

[54] RECEIVER FOR MULTIVALUED DIGITAL SIGNALS

[75] Inventors: Johannes M. M. Verbakel; Antonius J. P. Bogers; Paulo M. Castello Da Costa, all of Eindhoven, Netherlands

[73] Assignee: U.S. Philips Corporation, New York, N.Y.

[21] Appl. No.: 718,738

[22] Filed: Jun. 21, 1991

[30] Foreign Application Priority Data

Jul. 16, 1990 [NL] Netherlands ............... 9001608

[51] Int. Cl.$^5$ .................. H04L 25/10; H04L 25/49
[52] U.S. Cl. ............................... 375/17; 375/76; 375/98; 341/139
[58] Field of Search .................. 375/17, 18, 19, 20, 375/76, 98; 341/57, 126, 139; 329/361, 363; 307/358, 359

[56] References Cited

U.S. PATENT DOCUMENTS

| | | | |
|---|---|---|---|
| 3,509,279 | 4/1970 | Martin et al. | 375/98 |
| 4,823,360 | 4/1989 | Tremblay et al. | 375/76 |
| 4,841,301 | 6/1989 | Ichihara | 375/20 |
| 5,050,190 | 9/1991 | Shimada et al. | 375/76 |

Primary Examiner—Curtis Kuntz
Assistant Examiner—Young Tse
Attorney, Agent, or Firm—Leroy Eason

[57] ABSTRACT

In order to decide on the logic value of the output signal corresponding to a received multivalued digital signal, the receiver includes a comparator circuit (3) for comparing the amplitude of the output signal with a plurality of decision thresholds produced by an integrator (24). Based on such comparison, a regenerated signal is produced having the decided logic value and an amplitude which is proportional to the decision thresholds. An adaptation circuit (17) compares the regenerated signal amplitude with that of the output signal, and based on such comparison produces a control signal (z) for either increasing or decreasing the decision thresholds so as to conform the regenerated signal with the output signal, such adaptation being effected by selectively supplying either a positive or a negative voltage to the input of the integrator (24). To prevent erroneous decisions on the logic value of the output signal due to misadaptations of the decision thresholds, adaptation is prevented in the case of output signals which can only result in one direction (increase or decrease) of erroneous adaptation. Such signals are those for which the corresponding regenerated signals have either the lowest or the highest absolute logic values.

12 Claims, 3 Drawing Sheets

| SYM | x | y | S |
|-----|---|---|---|
| -3  | 0 | 0 | a |
| -1  | 1 | 0 | b |
| +1  | 1 | 1 | c |
| +3  | 0 | 1 | d |
FIG.2
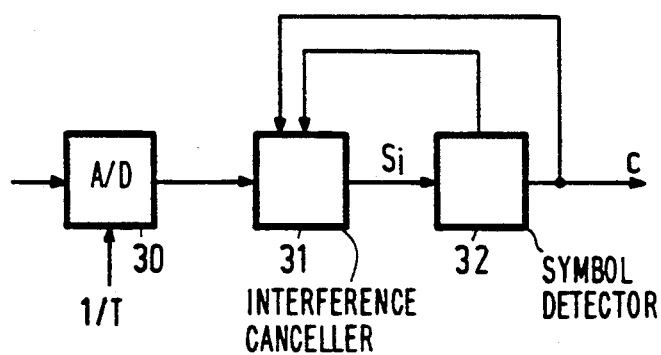
FIG.3
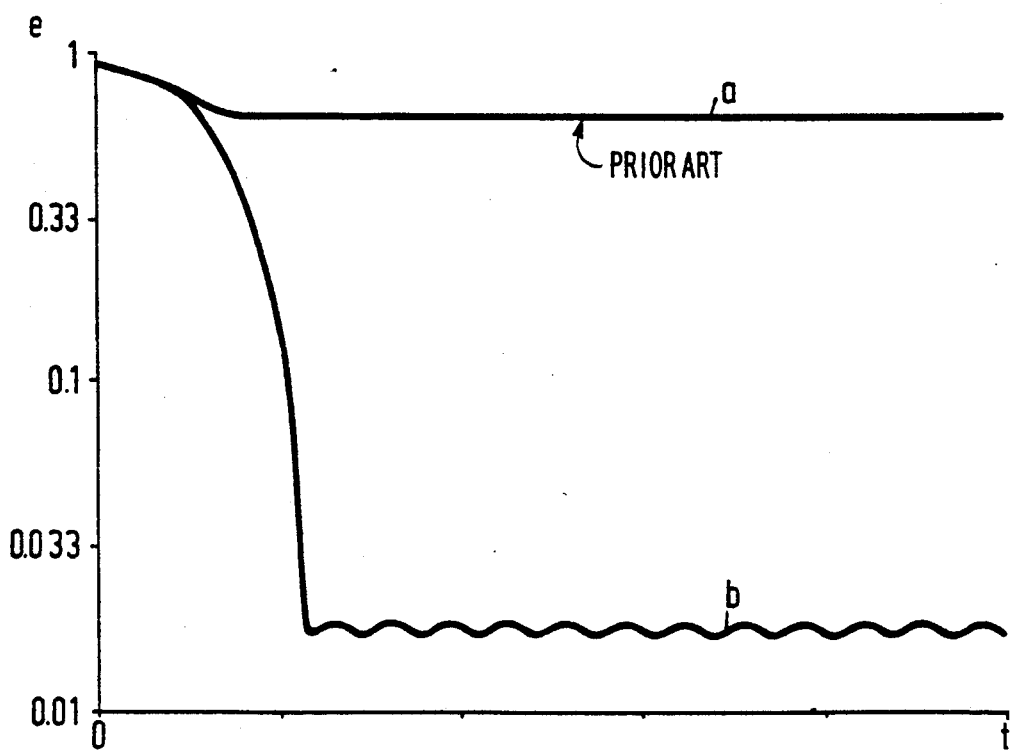
FIG.5

RECEIVER FOR MULTIVALUED DIGITAL SIGNALS

BACKGROUND OF THE INVENTION

1. Field of the Invention

The invention relates to a receiver for multivalued digital signals which comprises means for comparing the value of an input signal relative to a reference level with a number of decision thresholds, and generating an output symbol as a result of this comparison. Such receiver includes means for producing a regenerated signal on the basis of the output symbol and the decision thresholds, and means for generating an error signal on the basis of the difference between the absolute value of the input signal relative to the reference level and the absolute value of the regenerated signal. The receiver also includes reference means for deriving the decision thresholds from the error signal.

2. Description of the Related Art

A receiver of this type is known from published European Patent Application No. EP 0 157 598, which corresponds to U.S. Pat. No. 4,841,301, issued Jun. 20, 1989. Generally, such a receiver is used for data transmission by means of, for example, a landline connection or a radio link. To optimally utilize the transmission medium, transmission codes are often used in which the data signal can assume more than two levels. These signal levels usually have equidistant amplitudes and are defined with respect to a reference level which is often equal to 0. An example of such a code is the 2B1Q code in which the logic value of each symbol may assume one of the values $+3$, $+1$, $-1$ or $-3$. The associated physical signal levels may, for example, be equal to $+15$ volts, $+5$ volts, $-5$ volts and $-15$ volts.

Because the length of the transmission path and hence the signal loss on the transmission path may vary considerably, the amplitude of the received input signal at the receiver may show considerable variations for different situations. However, the receiver must be able to relate the physical signal value associated with a symbol to the logic value of that symbol despite the considerably varying signal amplitude.

In the prior-art receiver known from said European Patent Application, the decision on the logic value of the output symbol is made by means of a comparison of the value of the input signal to a number of equidistant decision thresholds. In order to minimize the possibility of an erroneous decision, the decision thresholds are to have a value equal to the mean value of two adjacent-amplitude signal levels so that the distance from a decision threshold to each of the two adjacent signal levels is equally large. In the code of said example the optimum values of the decision thresholds are equal to $+10$ volts, 0 and $-10$ volts.

Since the amplitude of the input signal at the receiver is not predetermined, the optimum values of the decision thresholds cannot be predetermined either and, therefore, they must be derived from the input signal. This is effected by deriving a regenerated signal from the logic value of the output symbol which is valid at a specific instant and the values of the decision thresholds valid at that instant, which regenerated signal is ideally equal to the physical value of the input signal. The regenerated signal is equal to the product of the logic value of the output symbol valid at a specific instant and half the absolute value of the difference between two decision thresholds valid at that instant.

In order to verify whether the regenerated signal has the correct values, the difference is determined between the physical value of the input signal and the regenerated signal. In order to reduce the difference between the actual and optimum values of the decision thresholds, the absolute values of the decision thresholds are enhanced or reduced respectively, in small steps if the regenerated signal is smaller or larger, respectively, than the physical value of the input signal. Adjustments of the decision thresholds are made in small steps in order to avoid the decision thresholds fluctuating strongly due to occasional disturbances of the input signal as a result of noise, crosstalk and so on.

The method of adapting the decision thresholds in the prior-art receiver poses a problem in that erroneous decisions on the logic value of the received symbol may lead to misadaptations of the decision thresholds, as will be clarified with the aid of the following numerical example. For this purpose, it is assumed that the input signal is a four-value signal having the logic values $+3$, $+1$, $-1$ and $-3$ and the physical values $+15$ volts, $+5$ volts, $-5$ volts and $-15$ volts. It is also assumed that the existing decision thresholds in the receiver are equal to $-4$ volts, 0 volts and $+4$ volts, which values in an absolute sense are too low because the physical value of the symbol having the logic value $+1$ is 5 volts. If the transmitter has transmitted a $+1$ symbol, the input signal of the receiver will be equal to $+5$ volts. Since the maximum decision threshold in the receiver is equal to 4 volts, the receiver will make the wrong decision that the logic value of the received symbol has the maximum logic value of $+3$. The corresponding regenerated signal will therefore be equal to $+6$ volts ($+3*4$ volts/2). As the absolute value (6) of the regenerated signal now exceeds the absolute value(s) of the input signal, it will appear to the receiver that the absolute value of the decision thresholds is too high and so the absolute decision threshold values will be lowered, although they are actually already too low. A similar misadaptation, to increase the absolute value of the decision thresholds, may also occur when they are already too high.

The misadaptations of the decision thresholds may lead to a constant or lengthy erroneous symbol detection as a result of which the receiver will not operate properly or only after a lengthy adjusting time.

SUMMARY OF THE INVENTION

It is an object of the invention to provide a receiver as set out in the preamble in which it no longer happens that the receiver does not start to operate properly or only after a lengthy adjusting time due to misadaptations of the decision thresholds.

For this purpose, the receiver is characterised in that it comprises classification means for classifying the output symbol into a plurality of categories on the basis of the logic value of the output symbol, and adaption means for either adapting or not adapting the decision thresholds in dependence on the category in which the output symbol is placed.

The invention is based on the innovative idea that it is certain for each output symbol which direction of adaptation of the decision thresholds might be erroneous and which direction of adaptation is certainly correct. On the basis of the possibly erroneous direction of adaptation belonging to an output symbol, the output symbol may be placed in one of the categories which have each their own way of adapting the decision thresholds. Adaptations which may be erroneous will now be disregarded; only those adaptations will be made which are definitely correct.

A possible classification into categories may be realised if the receiver places the output symbol in a first category when its absolute logic value is equal to the maximum logic value an output symbol may assume and, place the output an symbol in a second category when its absolute logic value is equal to the minimum positive logic value an output symbol may assume; all further output symbols being placed in a third category.

Owing to these measures, output symbols for which only an erroneous decision threshold reduction is possible are placed in the first category. For that category, an erroneous decision on the logic value of a received symbol leads to an output symbol having an absolute logic value equal to the maximum logic value which an output symbol may assume. The decision thresholds are then too low, and a misadaptation of the decision thresholds will take place if the decision thresholds are further reduced.

The output symbols for which only an erroneous decision threshold increase is possible are placed in the second category. For that category, an erroneous decision on the logic value of a received symbol leads to an output symbol having an absolute logic value equal to the minimum positive logic value which an output symbol may assume. The decision thresholds are then too high, and a misadaptation of the decision thresholds will take place if the decision thresholds are increased. By suitably preventing the adaptation of the decision thresholds for the two categories, all misadaptations of the decision thresholds may be avoided.

The symbols for which both an erroneous decision threshold increase and an erroneous decision threshold reduction is possible are placed in the third category. The absolute logic values of these symbols is comprised between the absolute logic values of the symbols placed in the categories 1 and 2.

An alternative classification is obtained if the receiver places the output symbol in a first category when its absolute logic value is equal to the maximum logic value which an output symbol may assume, and places the output symbol in a second category when its absolute logic value is equal to the minimum positive logic value an output symbol may assume some of the further output symbols being placed in the first category and the rest of the further output symbols being placed in the second category.

Owing to these measures there are no more than two categories and so the classification means may have a simpler structure. By implementing these measures the symbols for which only an erroneous reduction of the decision thresholds is possible are placed in category 1 and the symbols for which only an erroneous increase of the decision thresholds is possible are placed in category 2. For the symbols in these categories any misadaptations of the decision thresholds will be avoided.

The symbols for which both an erroneous reduction and an erroneous increase of the decision thresholds is possible may be placed in either of the two categories because, with no more than two categories, only an erroneous increase of the decision thresholds (category 2) or an erroneous reduction (category 1) of the decision thresholds can be avoided.

A specific embodiment of the receiver can be characterised in that equally many output symbols are placed in both the first and second categories.

As a result of the symmetry thus obtained, the decision thresholds will be adapted on average as often according to the adaptation method belonging to category 1 as according to the adaptation method belonging to category 2. Hence it is possible to adapt the decision thresholds equally rapidly when their values are either too high or too low.

Decision threshold adaptation is achieved by the receiver in that with a first category output symbol the decision thresholds will be increased if the absolute value of the regenerated signal voltage is smaller than the absolute value of the input signal voltage relative to the reference level, the decision thresholds being be maintained unchanged if the absolute value of the regenerated signal voltage is greater than the absolute value of the input signal voltage relative to the reference level. With a second category output symbol the decision thresholds will be reduced if the absolute value of the regenerated signal voltage is greater than the absolute value of the input signal voltage relative to the reference level, the decision thresholds being maintained unchanged if the absolute value of the regenerated signal voltage is smaller than the absolute value of the input signal voltage relative to the reference level.

Consequently, if the received symbol is in the first category, the decision thresholds will never be reduced. Thus, an erroneous reduction of these decision thresholds is avoided. Alternatively, if the received symbol is in the second category, the decision thresholds will never be increased and so an erroneous increase of the decision thresholds is avoided.

In a particular embodiment of the receiver the decision thresholds will be maintained at a constant level if the output symbol is placed in the third category. This embodiment results in avoiding all misadaptations of the decision thresholds due to erroneous decisions with respect to the received symbol, because there are no misadaptations for the symbols placed in categories 1 and 2 and no adaptations whatsoever are made for the symbols placed in category 3.

An additional advantage will be obtained if the receiver comprises adaptive signal conditioning means for blocking the adaptation if the decision thresholds are maintained at a constant level. The advantage obtained is that if the decision thresholds are kept constant, which implies that the received symbol may be erroneous, any misadaptation of the adaptive signal conditioning means will be omitted.

BRIEF DESCRIPTION OF THE DRAWINGS

The invention will be further explained with reference to the drawing Figures, in which:

FIG. 2 shows a Table of the possible values of the output signals x and y of the receiver as shown in FIG. 1 with the associated received symbols and states S of a switch 16 shown in FIG. 1;

FIG. 3 shows a simplified block diagram of a receiver according to the invention for a six-value signal, in which the decisions on the received symbol and the generation of the decision thresholds are made by means of a programmable processor;

FIG. 5 is a graph depicting the decision threshold deviations relative to their optimum values plotted against time, both for the prior-art receiver and for the receiver according to the invention.

DESCRIPTION OF THE PREFERRED EMBODIMENTS

Figure 1:
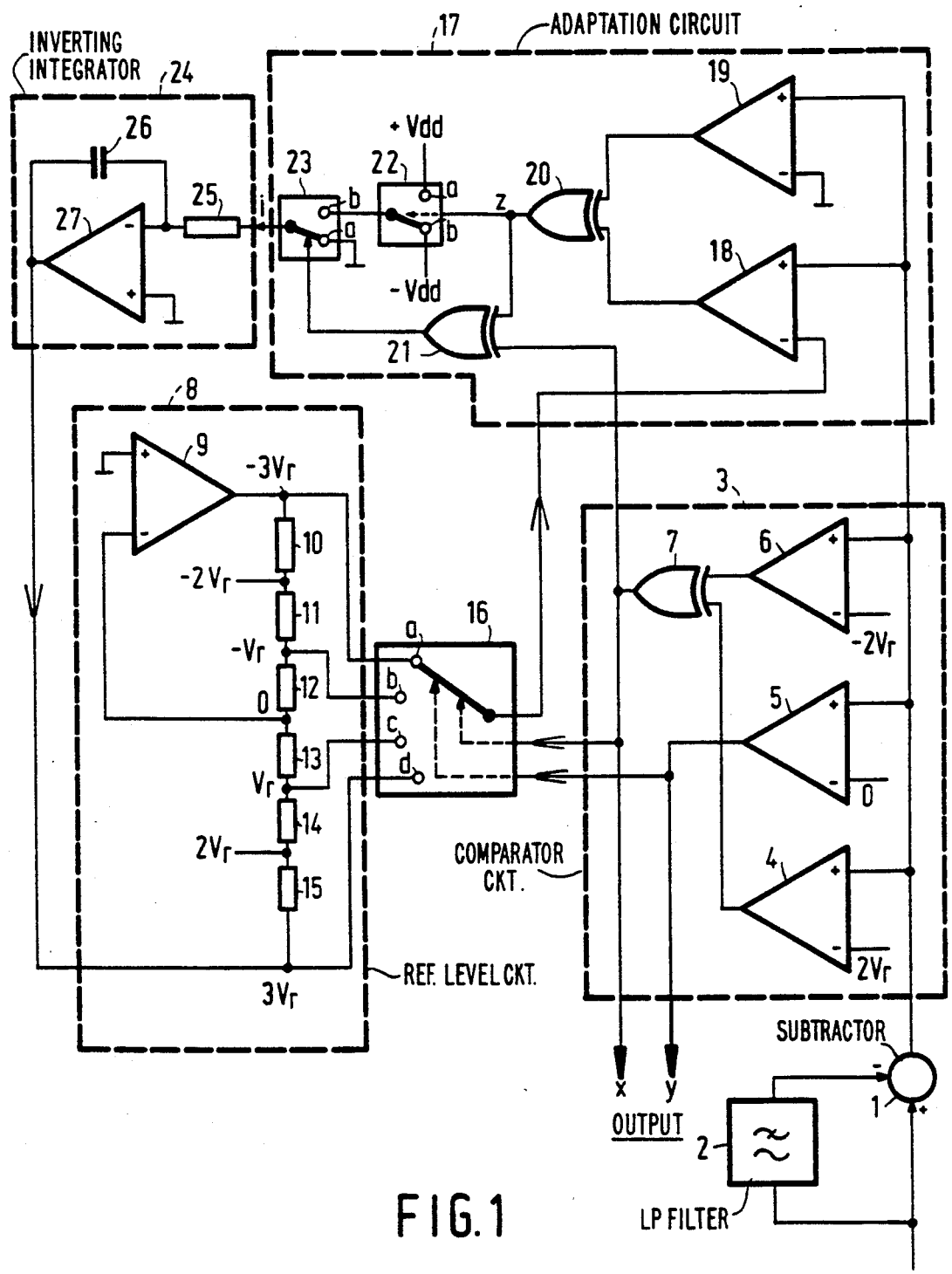
FIG. 1 shows an exemplary embodiment of a receiver according to the invention for a four-value signal, in which the decision thresholds are obtained by means of analog circuits.

In the receiver as shown in FIG. 1 the input signal is applied to the positive input of a subtracter 1 and to the input of a low-pass filter 2. The output of the low-pass filter 2 is connected to the negative input of the subtracter 1.

The output signal of the subtracter 1 is applied to a comparator circuit 3 in which this signal is applied to the positive inputs of three comparators 4, 5 and 6. The output signal of the subtracter 1 is in addition applied to an adaptation circuit 17 in which this signal is applied to the positive inputs of the comparators 18 and 19. The threshold voltages 2 $V_r$ and $-2 V_r$ coming from a reference level circuit 8 are applied to the negative inputs of the comparators 4, 5 and 6.

The outputs of the comparators 4 and 6 are connected to the inputs of an exlusive-OR gate 7. The output of the exclusive-OR gate 7 and the output of the comparator 5 together form the outputs of the receiver presenting output signals x and y.

The signals x and y are further applied to two control inputs of a selector switch 16 of which a contact (a) is connected to the output of an operational amplifier 9, a further contact (b) is connected to the junction of resistors 11 and 12, a further contact (c) is connected to the junction of resistors 13 and 14 and a fourth contact (d) is connected to the output of an inverting integrator 24. The central contact of switch 16 is connected to the negative input of the comparator 18.

The negative input of the comparator 19 is connected to zero potential. The outputs of comparators 18 and 19 are connected to the inputs of an exclusive-OR gate 20. The output of the exclusive-OR gate 20 is connected to the control input of a change-over switch 22 and to an input of an exclusive-OR gate 21. The second input of exclusive-OR gate 21 is connected to the output of the exclusive-OR gate 7. The output of the exclusive-OR gate 21 is connected to the control input of the change-over switch 23.

The positive supply voltage +Vdd is applied to a contact (a) of the change-over switch 22 and the negative supply voltage −Vdd is applied to a contact (b) of the change-over switch 22. The central contact of the change-over switch 22 is connected to a contact (b) of a change-over switch 23, while a contact (a) of the change-over switch 23 is connected to the zero potential. The central contact of change-over switch 23 is connected to the input of the inverting integrator 24 comprising a resistor 25, a capacitor 26 and an operational amplifier 27. The input of the inverting integrator 24 is constituted by one side of the resistor 25, whereas the other side of resistor 25 is connected to the inverting input of the operational amplifier 27. This inverting input is also connected to one side of the capacitor 26. The other side of the capacitor 26 is connected to the output of the operational amplifier 27, which output likewise constitutes the output of the integrator 24. The non-inverting input of the operational amplifier 27 is connected to the zero potential.

The output of the inverting integrator 24 is connected to the input of the reference circuit 8 in which it is applied to a resistor chain consisting of mutually equal resistors 10, 11, 12, 13, 14 and 15. The junction between the resistors 12 and 13 is connected to the inverting input of an operational amplifier 9. The non-inverting input of operational amplifier 9 is connected to the zero potential. The voltage $-2 V_r$ is available at the junction of the resistors 10 and 11. The voltage $-V_r$ is available at the junction of the resistors 11 and 12. The voltage $V_r$ is available at the junction of the resistors 13 and 14. The voltage 2 $V_r$ is available at the junction of the resistors 14 and 15.

In FIG. 1 it is assumed for explanatory purposes that the input signal is a four-value digital signal having the symbol values −3, −1, +1 and +3 which is symmetrical around a reference value, and in which the symbols occur equally often on average. The reference value of the input signal is determined by the low-pass filter 2. By subtracting this reference value from the input signal in subtracter 1, a symmetrical signal about a mean symbol value of 0 is obtained.

This symmetrical input signal is applied to the comparator circuit 3, in which three comparators compare it with the threshold voltages 2 $V_r$, 0 and $-2 V_r$ derived from a reference signal (3 $V_r$) by means of the reference level circuit 8. $V_r$ has a positive value in this respect. The output signals of the comparators will be equal to logic value "1" if the voltage on the positive input is larger (more positive or less negative) than the voltage on the negative input, and will be equal to logic value "0" if the voltage on the positive input is smaller (more negative or less positive) than the voltage on the negative input.

If the symmetrical signal is negative and smaller (more negative) than $-2 V_r$, therefore also being smaller than 2 $V_r$, the output signals of the comparators 4, 5 and 6 will all be equal to logic value "0". Because the outputs of the comparators 4 and 6 are connected to the input of the exclusive-OR gate 7, the output signal of the exclusive-OR gate 7 and thus the signal x will be equal to the logic value "0". The output signal y will also be equal to the logic value "0". Therefore (see FIG. 2) it is decided that the logic value of the output symbol is equal to −3.

If the symmetrical input signal is negative but larger (less negative) than $-2 V_r$, the output signals of the comparators 4 and 5 will be equal to logic value "0" and the output signal of the comparator 6 will be equal to the logic value "1". Since the input signals of the exclusive-OR gate 7 are now different, the output signal x will be equal to logic value "1". Therefore (see FIG. 2) the output signal y will be equal to logic value "0". The output symbol is now decided to be equal to −1.

If the symmetrical input signal is positive but smaller than 2 $V_r$, the output signals of the comparators 5 and 6 will be equal to logic value "1" and the output signal of comparator 4 will be equal to logic value "0". The signal x will now be equal to logic value "1". The output signal y will also be equal to logic value "1". Therefore the output symbol is now decided to be equal to +1.

If the symmetrical input signal is positive and larger (more positive) than 2 $V_r$, the output signals of the comparators 4, 5 and 6 will all be equal to logic value "1". The output signal x will be equal to logic value "0"

whereas the output signal y will be equal to logic value "1". The input symbol is now decided to be equal to +3.

In the Table shown in FIG. 2 the logic value of the outputs x and y is represented as a function of the output symbol.

The output signals x and y of comparator circuit 3 are also applied to the control inputs of the selector switch 16. Table 2 likewise represents the state(s) which selector switch 16 assumes in response to the signals x and y. If a symbol −3 is received, the switch 16 will have assumed state (a) and a regenerated signal −3 $V_r$ will be available at the central contact. If a symbol −1 is received, the switch 16 will have assumed state (b) and a regenerated signal −$V_r$ will be available at the central contact. If a symbol +1 is received, the switch 16 will have assumed state (c) and a regenerated signal $V_r$ will be available at the central contact. For the received symbol +3 a regenerated signal 3 $V_r$ will be available at the central contact.

In the adaptation circuit 17 the regenerated signal is compared to the symmetrical input signal by means of the comparator 18. If the symmetrical signal is larger (more positive or less negative) than the regenerated signal, the output signal of the comparator 18 will be equal to logic value "1". If the symmetrical input signal is smaller (more positive or less negative) than the regenerated signal, the output signal of the comparator 18 will be equal to logic value "0". If the symmetrical input signal is positive (i.e., larger than 0), the output signal of the comparator 19 will be equal to "1"; and if the symmetrical input signal is negative (i.e., smaller than 0) the output signal of the comparator 19 will be equal to logic value "0". Consequently, in the case where the symmetrical input signal is positive and larger than the regenerated signal, or negative and smaller (more negative) than the regenerated signal, the output signal z of the exclusive-OR gate 20 will be equal to logic value "0". That signifies that the reference voltage is to be increased. In the case where the symmetrical input signal is positive and smaller (less positive) than the regenerated signal, or negative and larger (less negative) than the regenerated signal, the output signal z of the exclusive-OR gate 20 will be equal to logic value "1". That signifies that the reference voltage is to be reduced.

The switch 22 will assume state (a) if the output signal z of the exclusive-OR gate 20 is equal to logic value "1" and will assume state (b) if the output signal z of the exclusive-OR gate 20 is equal to logic value "0". When z=1, and if the switch 23 has assumed state (b), the input of the inverting integrator 24 will be connected to the positive supply voltage and so integrator 24 will reduce the reference voltage and thereby reduce the decision thresholds. When z=0 and switch 23 is in state (b), the input of the inverting integrator 24 will be connected to the negative supply voltage and it will therefore increase the reference voltage and so the decision thresholds will be increased.

According to the invention the received symbols −3 and +3 can be placed in a first category and the received symbols −1 and +1 in a second category. While in the first category a reduction of the reference signal is prevented, and while in the second category an increase of the reference signal is prevented. This is prevented by setting the switch 23 to state (a) by applying a logic "1" signal to its control input, so that the input voltage of the inverting integrator 24 becomes equal to 0 and so the reference voltage remains constant.

From the Table in FIG. 2 it follows that if a received symbol is in the first category the signal x will be equal to logic value "0", and if the received symbol is in the second category the signal x will be equal to logic value "1". The output signal of the exclusive-OR gate 21 will be equal to logic value "1" signifying that adaptation of the reference voltage is to be prevented, if the received symbol is in category 1 (x=0) and the output signal z of the exclusive-OR gate 20 calls for a reduction of the reference signal (z=1), or if the received symbol is in category 2 (x=1) and the output signal z of the exclusive-OR gate 20 shows calls for an increase of the reference signal (z=0).

The inverting integrator 24 comprises a resistor 25, a capacitor 26 and an operational amplifier 27. According to a well-known property of a feedback operational amplifier, the voltage difference between its inputs remains equal to 0. Consequently, the current i flowing through the resistor 25 will also flow through capacitor 26 and charge capacitor 26 so that, at the output of the operational amplifier 27, there will be an output voltage which is proportional to the integrated value of the current i and thus also proportional to the integrated value of the input voltage of the integrator 24. Such output voltage is the reference voltage (3$V_r$) supplied to reference level circuit 8.

The reference level circuit 8 generates from the reference voltage (3 $V_r$) the threshold voltages −2$V_r$, 0 and 2 $V_r$ which are necessary for the comparator circuit 3 and the voltages −3$V_r$, −$V_r$, $V_r$ and 3 $V_r$ which are necessary for generating the regenerated symbol.

Since the operational amplifier 9 will cause the difference voltage between its input terminals to be equal to 0, the voltage at the junction of resistors 12 and 13 will be equal to 0. If it is assumed that the switch 16 does not form any load to the chain of resistors, an identical current will flow through all of the resistors 10, 11, 12, 13, 14 and 15 and, consequently, there will also be an identical voltage across each of these resistors. The voltage across each one of these resistors is equal to $V_r$. The desired voltages 3 $V_r$, 2 $V_r$, $V_r$, 0, −$V_r$, −2 $V_r$ and −3 $V_r$ will then be available at the junctions between the resistors.

In the receiver as shown in FIG. 3 the input signal is applied to an analog-to-digital converter 30. Also a clock signal is applied to the analog-to-digital converter 30 at a rate 1/T. The output of the analog-to-digital converter 30 is connected to adaptive signal processing circuit means 31 in this exemplary embodiment consisting of a decision feedback intersymbol interference canceller 31. The output of the canceller 31 is connected to an input of a symbol detector 32. At the output of the symbol detector 32 the output symbol C is available. The symbol detector 32 also has a second output connected to canceller 31

In FIG. 3 the input signal is applied to the analog-to-digital converter 30 which samples the analog input signal at a rate equal to the symbol rate 1/T to convert it into a digital signal so that the further signal processing may be effected in digitized form. The output samples of the analog-to-digital converter 30 are subjected to adaptive signal conditioning by decision feedback intersymbol interference canceller 31. It reproduces in response to the received symbols the intersymbol interference present in the received signal, and then subtracts this reproduced intersymbol interference from the received signal. Consequently, at the output of the intersymbol interference canceller 31 a signal is available which is substantially free from intersymbol interference as a result of which a better decision on the logic value of the received symbol is possible. The output signal of the canceller 31 is applied to a symbol detector 32. The symbol detector 32 is the functional equivalent of the receiver circuits in FIG. 1, and may be realised by a commercially available signal processor of the type PCB5010.

The functional operation of the symbol detector 32 is realised by programming of a processor of the aforesaid type in accordance with the flow chart shown in FIG. 4, in which the numbered instructions have the connotations as indicated in the following Table.

| NUMBER | INSCRIPTION | CONNOTATION |
|---|---|---|
| 42 | START | Initialisation. All variables are made equal to 0. |
| 43 | REF:=δ | The variable REF is made equal to a small positive number δ. |
| 44 | NEXT | A next symbol is waited for. |
| 45 | $|S_i|>$REF | Sample $S_i$ is compared to the variable REF. |
| 46 | $|S_i|>2*$REF | Sample $S_i$ is compared to 2* variable REF. |
| 47 | C:=SGN($S_i$) | Variable C (output symbol) is made equal to the sign of sample $S_i$ |
| 48 | $S_r$:=C*REF/2 | The reconstructed signal is calculated on the basis of the output symbol C and the variable REF. |
| 49 | D:=$S_i$–$S_r$ | The difference between the sample $S_i$ and reconstructed signal $S_r$ is calculated. |
| 50 | CD < 0 | The product of the output symbol C and the difference D is compared to zero. |
| 51 | REF*(1–α) | The variable REF is reduced. |
| 52 | C:=3*SGN($S_i$) | The received symbol C is made equal to 3* sign of the sample $S_i$. |
| 53 | LOCK | The adaptation of the adaptive intersymbol interference canceller is blocked. |
| 54 | C:=5*SGN($S_i$) | The received symbol C is made equal to 5* sign of the sample $S_i$. |
| 55 | $S_r$:=C*REF/2 | The reconstructed signal is calculated on the basis of the received symbol C and the variable REF. |
| 56 | D:=$S_i$–$S_r$ | The difference is calculated between the sample $S_i$ and the reconstructed signal $S_r$. |
| 57 | CD > 0 | The product of the output symbol C and the difference D is compared to zero. |
| 58 | REF*(1+α) | The reference level REF is increased. |

Figure 4:
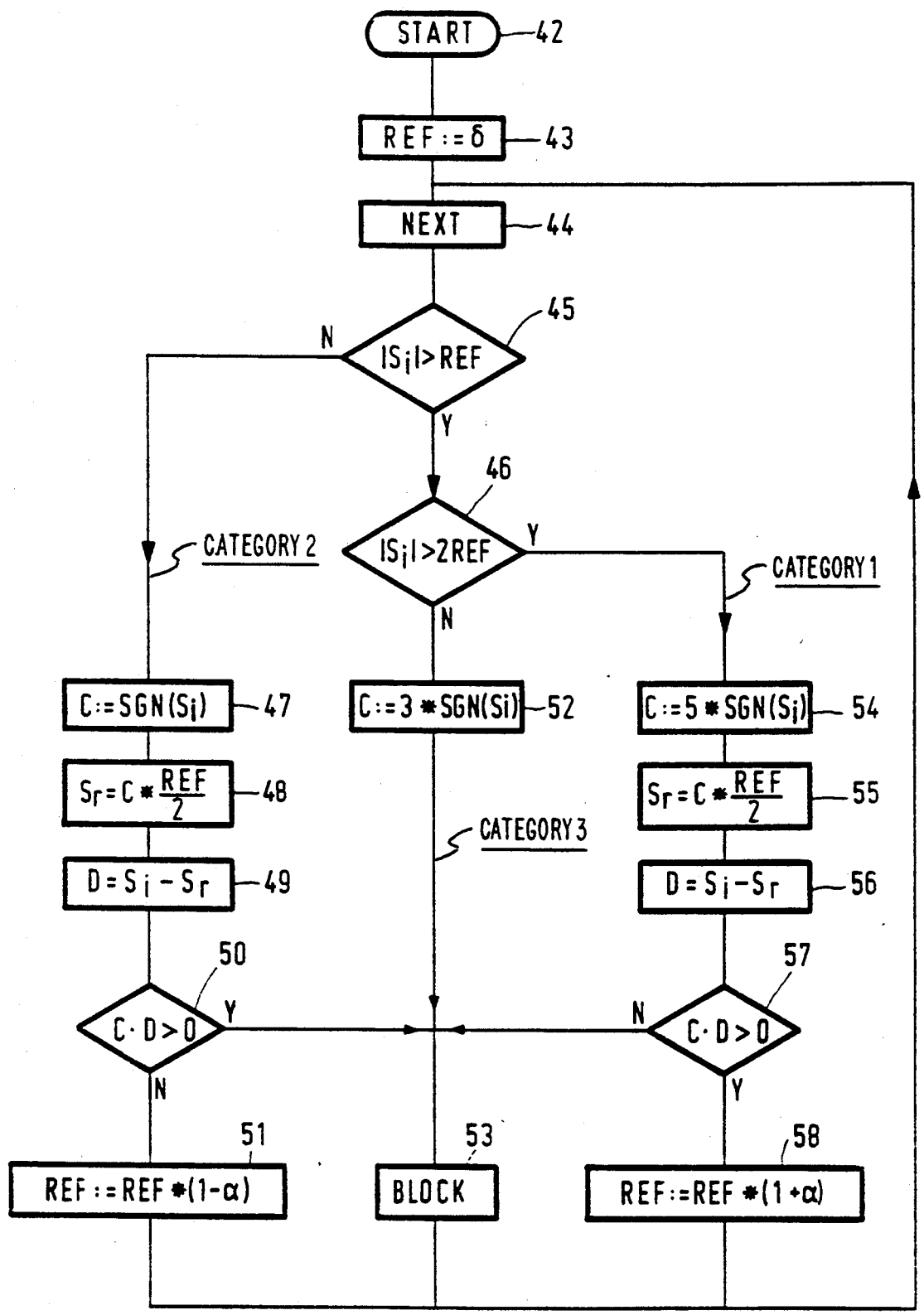
FIG. 4 shows a flow chart of a program for a programmable processor which makes the decision on the received symbol and provides the generation of the decision thresholds.

In FIG. 4 it is assumed that the input signal is a six-value signal that has the symbol values −5, −3, −1, +1, +3 and +5 and has a mean value 0. When the program is started, in instruction 42 all variables used are set to zero to obtain a clearly defined initial condition. In instruction 43 the variable REF, from which the decision thresholds are derived, is made equal to a small positive number δ. In the instruction 44 a sample $S_i$ of the input signal is waited for.

In the instruction 45 the absolute voltage value of the sample $S_i$ is compared with the reference signal REF. If the absolute voltage value of the sample $S_i$ is smaller than the reference signal REF, the sample $S_i$ will be placed in category 1. If the absolute voltage value of the sample $S_i$ is larger than the reference signal REF, it will then further be compared with the signal 2REF in instruction 46. If the absolute voltage value of the sample $S_i$ is smaller than 2REF the sample is placed in category 3, and if the absolute voltage value exceeds 2REF, the sample will be placed in category 2.

For the samples placed in category 2, the logic values are determined and the reference signal REF is adapted in the instructions 47, 48, 49, 50 and 51. Since the absolute logic value of a symbol in category 2 is always equal to 1, only the sign is to be added to this absolute logic value. This is performed in instruction 47 in which the complete logic value C is determined by determining the sign of the sample $S_i$. Then, in instruction 48, the reconstructed signal $S_r$ is determined and in instruction 49 the difference D between the input sample $S_i$ minus the reconstructed signal $S_r$ is determined.

The reference signal REF should be increased if the difference D and the received symbol C are both positive or if both are negative, their product thereby being positive and the reference signal should be reduced if one of the signals C or D is positive and the other is negative, their product thereby being negative.

Since, according to the inventive idea, an increase of the reference signal is to be prevented for symbols in category 2, in instruction 50 the sign of the product of C and D is determined. If this product is greater than zero this denotes that an increase of the reference signal should take place, but the adaptation will not be performed and in instruction 53 the adaptation of the intersymbol interference canceller 31 is blocked so as to avoid a misadaptation of this canceller. Then, instruction 44 is returned to.

However, if the product of C and D is negative, that denotes that a reduction of the reference signal is to be performed. This is effected in instruction 51 in which the reference signal is multiplied by a factor (1−α), where α is a small positive number (<1). In order to avoid decision thresholds fluctuating too strongly as a result of occasional disturbances of the receiver input signal, these decision thresholds are adapted gradually.

The symbol values for the samples placed in category 3 are determined and the reference signal REF is adapted in the instructions 52 and 53. Because the absolute value of the symbol in category 3 is always equal to 3, only the sign is to be added to this absolute value. This is effected by means of instruction 52 in which the output symbol C is determined by multiplying the sign of the input sample by 3.

Since, according to the invention, no adaptation of the reference signal is to take place for symbols in category 3, the reference signal is not adapted. In instruction 53 a signal is produced to block the adaptation of the intersymbol interference canceller 31.

For the input samples placed in category 1, the symbol values are determined and the reference signal REF adapted in the instructions 54, 55, 56, 57 and 58. Because the absolute value of the symbol in category 1 is always equal to 5, only the sign is to be added to this absolute value. This is effected by means of instruction 54 in which the symbol value C is determined by multiplying the sign function of the input sample by 5. Subsequently, in instruction 55, the reconstructed signal $S_r$ is determined and in instruction 56 the difference D between the input signal $S_i$ and the reconstructed signal $S_r$ is determined.

The reference signal REF should be increased if the difference D and the received symbol C are both positive or if both, their product thereby being positive. The reference signal should be reduced if one of the signals C or D is positive and the other is negative their product thereby being negative.

Since, according to the invention, a reduction of the reference signal is to be prevented for symbols placed in category 1, the product of C and D is compared to 0 in instruction 50. If this product is smaller than 0 this denotes that a reduction of the reference signal should take place, but the adaptation will not be carried out and in instruction 53 the adaptation of the intersymbol interference canceller 31 will be blocked before instruction 44 is returned to. If, however, the product of C and D is negative, an increase of the reference signal is to be effected. This takes place in instruction 58 in which the reference signal is multiplied by a factor $(1+\alpha)$.

In FIG. 5, curve (a), the relative difference E between the actual decision thresholds and the optimum decision thresholds, is plotted against time for the prior-art receiver. In curve (b) this difference is plotted for a receiver according to the invention. Both curves are based on the same series of transmitted symbols.

It will be evident that in the prior-art receiver for a given series of input symbols the difference E remains large so that erroneous decisions on the logic value of the output symbol are made continuously. With the receiver according to the invention the difference E will rapidly diminish to a very small value.

We claim:

1. A receiver for multivalued digital signals, the voltage level of a received signal with respect to a reference level thereof signifying a logic value of said signal; said receiver comprising:
   comparator circuit means for comparing the voltage level of a received signal with a number of decision threshold voltage levels corresponding to respective logic values, and producing from such comparisons an output signal having a logic value corresponding to the logic value of the received signal;
   circuit means for regenerating said decision thresholds, such circuit means being coupled to said comparator circuit means to receive said output signal and derive therefrom a regenerated signal, said regenerated signal being at a voltage level equal to a decision threshold which corresponds to the logic value of said output signal; and
   adaptation circuit means for receiving said regenerated signal and said output signal and deriving therefrom an error signal corresponding to the difference therebetween;
   said adaptation circuit means comprising means for adjusting the decision thresholds generated by said decision threshold generating means in accordance with said error signal, so as to reduce the difference between said regenerated signal and said received signal;
   characterized in that said adaptation circuit means further comprises control means for classifying the output signal into one of at least two different categories on the basis of the logic value thereof, said control means being adapted to
   prevent said decision threshold adjusting means from reducing the decision thresholds when the regenerated signal is in a first of said categories; and
   prevent said decision threshold adjusting means from increasing the decision thresholds when the regenerated signal is in a second of said categories.

2. A receiver as claimed in claim 1, characterized in that said classification means places the output signal in said first category when the absolute logic value thereof corresponds to a predetermined maximum logic value, and places the output signal in said second category when the absolute logic value thereof corresponds to a predetermined minimum positive logic value; the output signal being placed in a third of said categories when the absolute logic value thereof does not correspond to either of said minimum and maximum logic values.

3. A receiver as claimed in claim 2, wherein said adaptation circuit is characterized in that:
   for an output signal which is in said first category, said adaptation circuit will increase the decision thresholds if the magnitude of the output signal is less than that of the corresponding received signal relative to said reference level, and will leave the decision thresholds unchanged if the magnitude of the output signal exceeds that of the corresponding received signal relative to said reference level; and
   for an output signal which is in said second category, said decision circuit will reduce the decision thresholds if the magnitude of the output signal exceeds that of the corresponding received signal relative to said reference level, and will leave the decision thresholds unchanged if the magnitude of the output signal is smaller than that of the corresponding received signal relative to said reference level.

4. A receiver as claimed in claim 3, further comprising adaptive signal conditioning means for conditioning a received signal, adaptation of said conditioning means being blocked by said adaptation circuit means when said control means prevents adjustment of said decision thresholds.

5. A receiver as claimed in claim 2, wherein said adaptation circuit will leave the decision thresholds unchanged for an output signal which is in said third category.

6. A receiver as claimed in claim 2, further comprising adaptive signal conditioning means for conditioning a received signal, adaptation of said conditioning means being blocked by said adaptation circuit means when said control means prevents adjustment of said decision thresholds.

7. A receiver as claimed in claim 1, characterized in that said classification means places the output signal in said first category when the absolute logic value thereof corresponds to a predetermined maximum logic value, and places the output signal in said second category when the absolute logic value thereof corresponds to a predetermined minimum positive logic value; output signals which do not correspond to either of said minimum and maximum logic values being distributed in said first and second categories.

8. A receiver as claimed in claim 7, characterized in that output signals which do not correspond to either of said first and second categories are equally distributed in both of such categories.

9. A receiver as claimed in claim 8, wherein said adaptation circuit is characterized in that:
   for an output signal which is in said first category, said adaptation circuit will increase the decision thresholds if the magnitude of the output signal is less than that of the corresponding received signal relative to said reference level, and will leave the decision thresholds unchanged if the magnitude of the output signal exceeds that of the corresponding received signal relative to said reference level; and for an output signal which is in said second category, said decision circuit will reduce the decision thresholds if the magnitude of the output signal exceeds that of the corresponding received signal relative to said reference level, and will leave the decision thresholds unchanged if the magnitude of the output signal is smaller than that of the corresponding received signal relative to said reference level.

10. A receiver as claimed in claim 7, wherein said adaptation circuit is characterized in that:
for an output signal which is in said first category, said adaptation circuit will increase the decision thresholds if the magnitude of the output signal is less than that of the corresponding received signal relative to said reference level, and will leave the decision thresholds unchanged if the magnitude of the output signal exceeds that of the corresponding received signal relative to said reference level; and
for an output signal which is in said second category, said decision circuit will reduce the decision thresholds if the magnitude of the output signal exceeds that of the corresponding received signal relative to said reference level, and will leave the decision thresholds unchanged if the magnitude of the output signal is smaller than that of the corresponding received signal relative to said reference level.

11. A receiver as claimed in claim 7, further comprising adaptive signal conditioning means for conditioning a received signal, adaptation of said conditioning means being blocked by said adaptation circuit means when said control means prevents adjustment of said decision thresholds.

12. A receiver as claimed in claim 1, further comprising adaptive signal conditioning means for conditioning a received signal, adaptation of said conditioning means being blocked by said adaptation circuit means when said control means prevents adjustment of sid decision thresholds.

* * * * *